United States Patent
Liu et al.

(10) Patent No.: US 8,361,225 B2
(45) Date of Patent: *Jan. 29, 2013

(54) LOW ETCH PIT DENSITY (EPD) SEMI-INSULATING III-V WAFERS

(75) Inventors: Weiguo Liu, San Leandro, CA (US); Morris S. Young, Fremont, CA (US); M. Hani Badawi, Santa Clara, CA (US)

(73) Assignee: AXT, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/207,291

(22) Filed: Aug. 10, 2011

(65) Prior Publication Data

US 2011/0293890 A1    Dec. 1, 2011

Related U.S. Application Data

(63) Continuation-in-part of application No. 12/506,209, filed on Jul. 20, 2009, now abandoned, which is a continuation of application No. 11/801,712, filed on May 9, 2007, now Pat. No. 7,566,641, application No. 13/207,291, which is a continuation of application No. 12/991,911, filed as application No. PCT/US2008/005959 on May 9, 2008, which is a continuation of application No. 11/801,712.

(30) Foreign Application Priority Data

Jan. 8, 2008  (CN) .......................... 2008 1 0000938

(51) Int. Cl.
*C01B 30/02* (2006.01)

(52) U.S. Cl. ......................................................... 117/83

(58) Field of Classification Search .................. 438/478; 117/81–83

See application file for complete search history.

(56) References Cited

U.S. PATENT DOCUMENTS

| | | | |
|---|---|---|---|
| 4,999,082 A | 3/1991 | Kremer et al. |
| 5,137,847 A | 8/1992 | Shimakura et al. |
| 5,584,929 A | 12/1996 | Kawase |
| 6,007,622 A | 12/1999 | Kawase et al. |
| 6,896,729 B2 | 5/2005 | Liu et al. |
| 7,566,641 B2 | 7/2009 | Liu et al. |
| 2001/0006040 A1 | 7/2001 | Kawase et al. |
| 2001/0008115 A1 | 7/2001 | Kawase et al. |
| 2002/0148402 A1 | 10/2002 | Kou et al. |

(Continued)

FOREIGN PATENT DOCUMENTS

| CN | 1765006 A | 4/1997 |
|---|---|---|
| EP | 803593 | 4/1997 |

(Continued)

OTHER PUBLICATIONS

W.A. Gault et al., "A Novel Application of the Vertical Gradient Freeze Method to the Growth of High Quality III-V Crystals", Journal of Crystal Growth 74, pp. 491-506 (1986).

(Continued)

*Primary Examiner* — Savitr Mulpuri
(74) *Attorney, Agent, or Firm* — Alston & Bird LLP

(57) ABSTRACT

Systems and methods of manufacturing wafers are disclosed using a low EPD crystal growth process and a wafer annealing process are provided resulting in III-V/GaAs wafers that provide higher device yields from the wafer. In one exemplary implementation, there is provided a method of manufacturing a group III based material with a low etch pit density (EPD). Moreover, the method includes forming polycrystalline group III based compounds, and performing vertical gradient freeze crystal growth using the polycrystalline group III based compounds. Other exemplary implementations may include controlling temperature gradient(s) during formation of the group III based crystal to provide very low etch pit density.

2 Claims, 4 Drawing Sheets

U.S. PATENT DOCUMENTS

| | | |
|---|---|---|
| 2002/0175337 A1 | 11/2002 | Chen et al. |
| 2003/0037721 A1 | 2/2003 | Liu et al. |
| 2003/0145782 A1 | 8/2003 | Kawase et al. |
| 2003/0172870 A1 | 9/2003 | Liu et al. |
| 2006/0183329 A1 | 8/2006 | Leung et al. |
| 2006/0260536 A1 | 11/2006 | Wachi et al. |
| 2006/0272572 A1 | 12/2006 | Uematsu et al. |
| 2007/0012242 A1 | 1/2007 | Jurisch et al. |
| 2009/0098377 A1 | 4/2009 | Oshika |

FOREIGN PATENT DOCUMENTS

| | | |
|---|---|---|
| WO | WO2004/079786 A | 9/2004 |

OTHER PUBLICATIONS

A Kleinwechter et al., "Mass Production of Large-Size GaAs Wafers at Freiberger", 2001 GaAs MANTECH Intl. Conference, Las Vegas, NV, pp. 1-12 and 15-21 (May 21-24, 2001).

Freiberger Catalog "Semi-insulating Gallium Arsenide Wafers", 6 pp (2000).

T. Kawase et al., "Low-dislocation-density and Low-residual-strain Semi-insulating GaAs Grown by Vertical Boat Method", 1996 IEEE Semiconducting and Semiinsulating Materials Conference, IEEE SIMC-9, pp. 275-278 (Apr. 29-May 3, 1996).

Y. Hagi et al., "Low Dislocation Density 3-inch Si doped GaAs Crystals by Vertical Boat Growth", 1996 IEEE Semiconducting and Semiinsulating Materials Conference, IEEE SIMC-9, pp. 279-282 (Apr. 29-May 3, 1996).

Freiberger Catalog "Semi-conducting Gallium Arsenide Wafers", 6 pp (2000).

B. E. Freidenreich et al., "Improved uniformity of SI-VB GaAs by annealing", Semi-insulating III-V Materials, Ixtapa, Mexico pp. 105-110 (1992).

Rumsby, D. et al., "Improved Uniformity of LEC Undoped Gallium Arsenide Produced by High Temperature Annealing GaAs", IC Symposium, 1983 IEEE, pp. 34-37.

Prosecution of counterpart Chinese application No. 2008-10000938.8, including 1st Chinese Office Action dated Sep. 27, 2010 (and English language translation thereof) as well as Amendment/Response to Office Action filed Mar. 14, 2011.

Information from counterpart PCT application, including International Search Report dated Aug. 15, 2008 (2 pgs), Written Opinion dated Aug. 15, 2008 (5 pgs), and International Preliminary Report on Patentability dated Nov. 10, 2009 (6 pgs).

Prosecution of related U.S. Appl. No. 12/506,209.

Prosecution of related U.S. Appl. No. 11/801,712.

Prosecution of related U.S. Appl. No. 12/991,911.

English Translation of Second Chinese Office Action, dated Jan. 18, 2012; CN 200810000938.8.

Second Office Action in Chinese, dated Jan. 18, 2012; CN 200810000938.8.

LOW ETCH PIT DENSITY (EPD) SEMI-INSULATING III-V WAFERS

CROSS-REFERENCE TO RELATED APPLICATION(S)

This application: is a continuation/continuation-in-part of application Ser. No. 12/506,209, filed Jul. 20, 2009, published as US2010/0001288A1, which is a continuation of application Ser. No. 11/801,712, filed May 9, 2007, published as US2008/0280427A1, now U.S. Pat. No. 7,566,641; and is a continuation of application Ser. No. 12/991,911, filed Nov. 11, 2010, published as US2011/0089538A1, which is a 371 filing of international PCT application No. PCT/US2008/005959, filed May 9, 2008, publication No. WO 2008/140763, thereby claiming benefit/priority of ancestor U.S. application Ser. No. 11/801,712, filed May 9, 2007, now U.S. Pat. No. 7,566,641 and Chinese application 200810000938.8, filed Jan. 8, 2008, all of which are incorporated herein by reference in entirety.

BACKGROUND

1. Field

The present invention relates to semiconductor fabrication, and, more particularly, to systems and methods of manufacturing low etch pit density (EPD) group III-V wafers that can be used to manufacture devices, such as Heterostructure Bipolar Transistors (HBT) and pseudo-morphic High Electron Mobility (pHEMT) devices, as well as to wafers produced thereby.

2. Description of Related Information

It is well known in the group III-V/Gallium Arsenide (GaAs) industries that a etch pit density (EPD) level of a substrate is very important in minority carrier device reliability and in the yield of devices from the substrate. For example, regarding certain GaAs electronic devices, such as heterostructure bipolar transistors (HBTs) and pseudomorphic high electron mobility transistors (pHEMTs), historically, substrate EPD is not known to be a determining factor in device yield. However, it is now known that dislocations may bear relation to at least certain device failure, for example HBT device failures, as recently shown by Low et. al. (Low, T. S. et al., The Role of Substrate Dislocations in Causing Infant Failures in High Complexity InGaP/GaAs HBT ICs, 2007). Furthermore, light point defects (LPDs) [also known as localized light scatterers (LLS) (see SEMI M54-0304—attached)] are undesirable for the subsequent steps, such as epitaxial growth, which are performed on the substrates. Of particular importance is the reduction of crystal "non-particulate" LPDs which may occur as a result of the arsenic precipitates in the grown ingots. For GaAs, these high LPDs typically originate as a result of the high arsenic overpressure used during the crystal growth of the ingots.

Wafer annealing is well known. In addition, ingot annealing is known as described in "Improved Uniformity of LEC Undoped Gallium Arsenide Produced by High Temperature Annealing" by Rumsby et al., GaAs IC Symposium, pp. 34-37 (1983).

Techniques for growing semiconductor crystals using a vertical gradient freeze (VGF) and carbon doping are known, such as those disclosed in U.S. Pat. No. 6,896,729 to Liu et al. It is desirable to provide systems and methods of manufacturing low etch pit density (EPD) GaAs and other III-V compound wafers, as well as the wafers themselves, using VGF and annealing techniques, and aspects consistent with the innovations herein relate to the provision thereof.

SUMMARY

Systems, methods, and wafers consistent with the invention relate to manufacture of group III-V semiconductor devices using low EPD crystal growth and wafer annealing processes achieving group III-V (e.g., GaAs, etc.) wafers with higher device yields.

In one exemplary implementation, there is provided a method of manufacturing a group III based material with a low etch pit density (EPD). Moreover, the method includes forming polycrystalline group III based compounds, and performing vertical gradient freeze crystal growth using the polycrystalline group III based compounds. Other exemplary implementations may include controlling temperature gradient(s) during formation of the group III based crystal to provide very low etch pit density.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which constitute a part of this specification, illustrate various embodiments and aspects of the present invention and, together with the description, explain the principles of the invention. In the drawings.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed invention. Instead, they are merely some examples consistent with certain aspects related to the innovations herein. Wherever possible, the same reference numbers will be used throughout the drawings to refer to the same or like parts.

The systems and methods herein are applicable to the manufacture of GaAs substrates and it is in this context that the innovations will be described. The innovations have greater utility since they can be used, for example, to manufacture other types of substrates, such as indium phosphide (InP), gallium phosphide (GaP) and other related III-V compound semiconductors.

Figure 1:
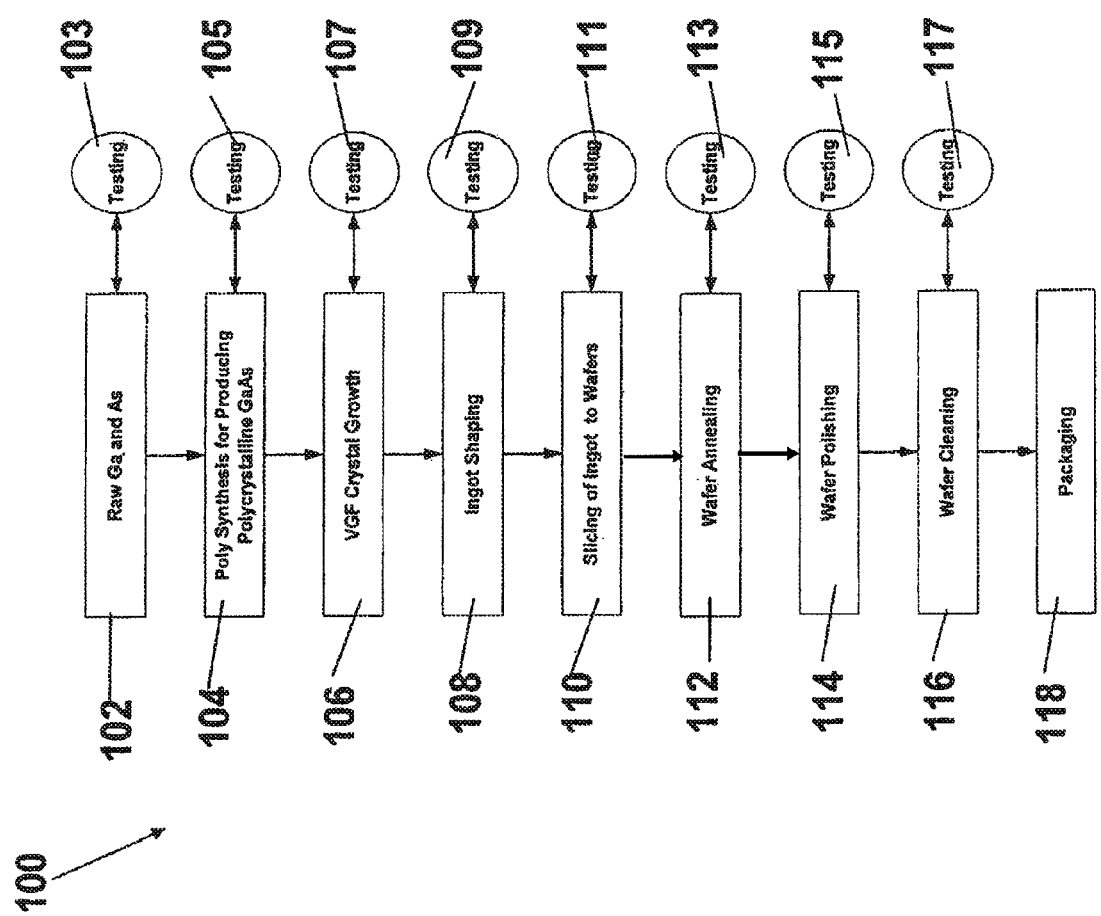
FIG. 1 illustrates a method for fabricating group III-V wafers using VGF crystal growth techniques consistent with certain aspects related to the innovations herein.

FIG. 1 illustrates a method for fabricating GaAs wafers using a vertical growth furnace process 100. The process results in low light point defect, low etch pit density GaAs substrates. This process may also be used to fabricate indium phosphide (InP), gallium phosphide (GaP) or other related III-V compound semiconductors. The fabrication method is a combination of a very low EPD crystal growth process (described below in more detail) and a wafer annealing process (described in more detail below) to achieve the very low LPD. The growth of very low EPD, semi-insulating GaAs (or other group III-V) wafers by the VGF process results in high device yield in highly integrated GaAs (or other) circuits. According to aspects herein, wafer annealing processes consistent with the innovations herein may yield very low LPD and/or, in further aspects, controlled levels of Oxygen in the wafers. Low LPD wafers are desired by all semiconductor epitaxial growers since higher LPDs result in lower device yields from the substrates with the higher LPDs due to failure of devices made with the higher LPD substrate.

Returning to FIG. 1, the raw materials (102) are 7N grade (99.9999999%) Arsenic (As) and Gallium (Ga) from qualified vendors and may be tested at step 103. The raw material is directly used in a known poly synthesis process (104) to produce polycrystalline GaAs and may be tested at step 105. Once the polycrystalline GaAs is generated, vertical gradient freeze (VGF) crystal growth occurs (106) as described in more detail in U.S. Pat. No. 6,896,729 to Liu et al. which is incorporated herein by reference. Consistent with Liu et al., VGF fabrication according to the present innovations encompass crystal growth technology, apparatus, and processes whereby large single crystal ingots are grown with a very high level of structural uniformity and low defect density. According to one exemplary implementation, controlled growth of GaAs is achieved by placing a dopant material in an ampoule outside a growth crucible, not in contact with the molten charge. Since the dopant materials are separated from the melt or the internal wall of the crucible, the process is favorable for achieving a high single crystal growth yield. Exemplary VGF processes for achieving controlled incorporation of carbon in the growth of semi-insulating GaAs material, here, may include: (1) loading charges of GaAs raw materials into the crucible, (2) placing carbon doping sources within, generally at a low end of, the ampoule, (3) loading the crucible with the GaAs charges into the ampoule, (4) evacuating/sealing under vacuum the ampoule containing the dopant, the crucible, the GaAs charges, and B2O3 material, and (5) heating/melting the charge and then controlling the liquid-solid interface, wherein control of the amount of the dopant and/or the temperature are used to grow semi-insulating GaAs ingots with high uniformity and low defects. The VGF grown crystals may be tested (107) via Hall measurements and etch pit density measurements. As a result of the VGF Semi-insulating GaAs crystal growth process, the GaAs crystal has an etch pit density of less than 900/cm$^2$, with the lowest EPD achieved about 600/cm$^2$ for 3" diameter GaAs crystals. There are conventional processes that can produce Semi-insulating GaAs substrates with the EPD as low as 900/cm$^2$, however none of the conventional processes can produce GaAs or other similar wafers with less than 900/cm$^2$ EPD. Thus, typical processes may achieve an EPD of 900/cm$^2$, but cannot achieve the lower EPD levels provided by this VGF process.

To achieve the low EPD, several VGF parameters are carefully controlled. The parameters may include the shape of the melt/crystal interface which is controlled to be concave or convex to the melt front at ±2 mm, crystallization velocity from 2-16 mm/hour, and the temperature gradient at the melt/crystal interface between 0.1 to 2 degrees C./cm. Once the VGF crystals are grown (and optionally tested), a well known ingot shaping process (108) is conducted and the shaped ingot may also be tested (109). Once the ingot is shaped, the ingot is sliced into wafers (110) and the wafers may be optionally tested using Hall and etch pit density measurements (111). The above processes may also be used to produce InP and other III-V compound wafers. As a result of this process, low EPD GaAs wafers are produced.

Once the low EPD wafers have been sliced from the ingot, a wafer annealing process (112) is performed wherein the annealed wafers may be tested (113). Instead of the typical three-stage annealing process, a one-stage annealing process is used. During that process the wafers are loaded vertically into a horizontal quartz boat and inserted in a horizontal quartz ampoule along with the required Arsenic lumps. These Arsenic lumps are carefully weighed to provide the needed vapor pressure at the annealing temperature to avoid any Arsenic dissociation from the substrates. The ampoule is then pumped down to a high vacuum level (<5E-3 Torr) and sealed. The ampoule and its contents are then inserted into a horizontal 3-zone furnace and the heating of the ampoule and its contents to the desired set (platform) temperature is initiated. When the platform temperature (900 C to 1050 C) is reached it is held constant for several hours (10 to 48 hours). Subsequently, the heating is decreased and the ampoule is allowed to cool down to room temperature within a set time (6 to 24 hrs). During the one-stage annealing process, the oxygen level in the GaAs wafers is controlled by adjusting the vacuum level in the ampoule The annealing process conditions were optimized for heating rate, platform temperature and cooling rate to achieve very low LPD levels (<1/cm$^2$). As a result of the annealing process, the wafer has light point defects as low as <1 cm$^{-2}$ with particle size>0.3 µm. In addition, the wafer may have as low as <50 particles/wafer having a particle size>0.3 µm for 6" wafers.

Once the low EPD wafers are annealed and optionally tested for LPD and impurity levels, a known wafer polishing process (114) is performed that polishes the low EPD wafers and the polished wafers may be optionally tested (115). Once the wafers are polished, the wafers are cleaned (116) and optionally tested (117) and then packaged for shipping to customers (118).

Figure 2:
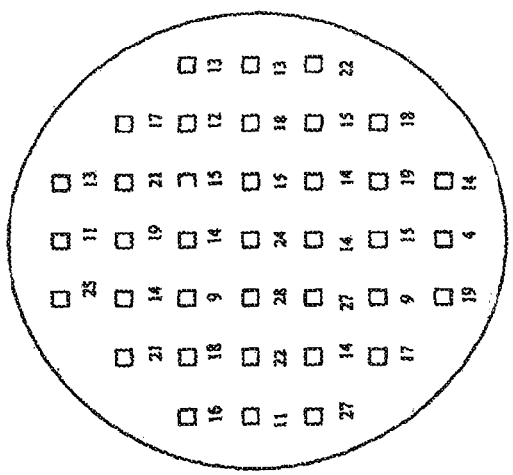
FIG. 2 illustrates an EPD map for an exemplary wafer consistent with certain aspects related to the innovations herein.

The EPD measurements are performed in accordance with SEMI M36-0699 and ASTM Test Method F1404-92. An example of the EPD level as measured at 37 points (each point having an area of 0.024 cm$^2$) is shown in FIG. 2. This example shows an average EPD of 695/cm$^2$. Note that the EPD is not evenly distributed across the wafer and for this sample, the maximum EPD is 1167/cm$^2$. All the numbers shown in FIG. 2 are actual counts of the number of EPDs—to obtain the EPD value, these numbers should be divided by the unit area (namely, 0.024 cm$^2$) to obtain the number per cm$^2$.

Figure 3:
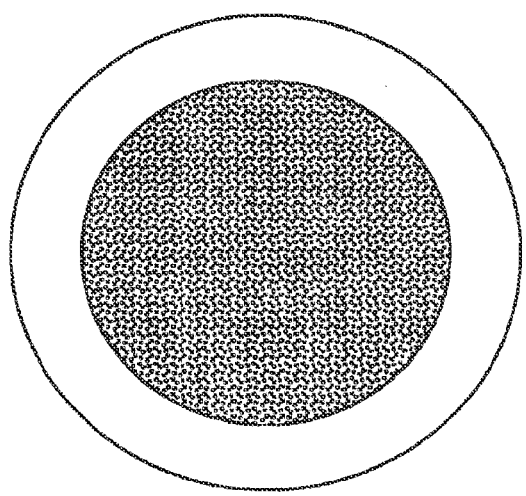
FIG. 3 illustrates the LPD distribution for a wafer that has not been annealed.
Figure 4:
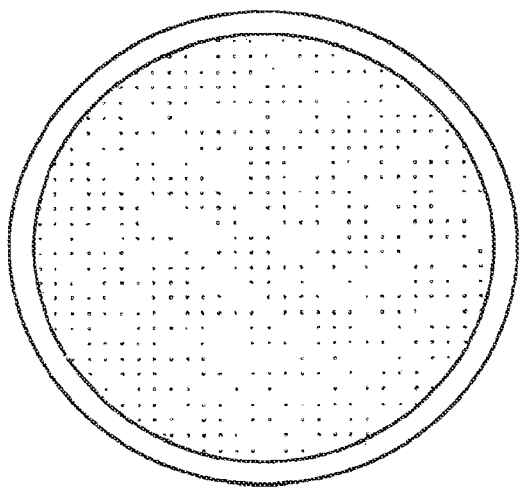
FIG. 4 illustrates the LPD distribution for a wafer that has been annealed according to the process of the invention consistent with certain aspects related to the innovations herein.

The LPD measurements are performed using a KLA-Tencor Surfscan 6220 system. FIG. 3 shows the results of measurements made on an unannealed wafer. With no wafer annealing, the average LPD density is greater than 164 cm$^{-2}$ (greater than 30,000 over the entire 6 inch diameter wafer surface). FIG. 4 shows the results of measurements made on an exemplary annealed wafer. The average LPD density is less than 1 cm$^{-2}$ (less than 50 over the entire 6 inch diameter wafer surface).

Figure 5A:
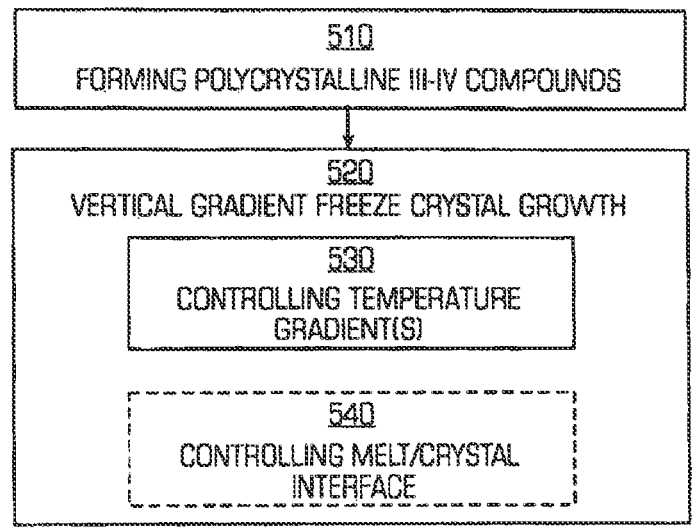
FIGS. 5A and 5B illustrate methods for fabricating group III-V wafers using crystal growth techniques consistent with certain aspects related to the innovations herein.
Figure 5B:
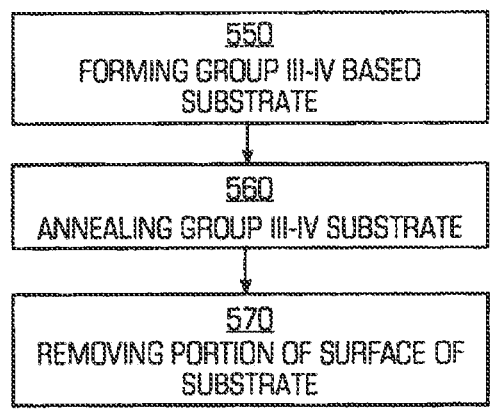

FIGS. 5A and 5B illustrate methods for fabricating group III-V wafers using crystal growth techniques consistent with certain aspects related to the innovations herein. For example, FIG. 5A is consistent with a method for manufacture a group III based material with a low etch pit density, the method comprising, forming polycrystalline group III based compounds 510, and performing vertical gradient freeze crystal growth using the polycrystalline group III based compounds 520. Further, the crystal growth process may include controlling temperature gradient(s) 530. By way of example, such control may include controlling temperature gradient of the group III based crystal during formation of the group III based crystal such that the group III based crystal has an etch pit density of less than about 900 per square centimeter. In another exemplary implementation, the crystal growth process may include controlling temperature gradient(s) associated with the group III based crystal during the vertical gradient freeze crystal growth wherein a crystal/melt temperature gradient is maintained between about 0.1 to about 2 degrees Celsius/cm. Moreover, the growth process may also optionally include controlling melt/crystal interface 540, such as controlling one or both of a shape and/or a temperature gradient of a melt/crystal interface.

FIG. 5B illustrates an exemplary method of manufacturing a substrate with low light point defects, the method comprising forming a group III-V based substrate 550, annealing the group III-V based substrate 560, for example, by using a single step annealing process, and removing a portion of the surface of the group III-V based substrate 570. Performed consistent with the innovations herein, a substrate may be formed having a light point defect density of less than about 1 per square centimeter per gallium arsenide based substrate with a particle size of equal to or greater than about 0.3 micrometers.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A method of manufacturing a 6 inch diameter gallium arsenide wafer with a low etch pit density (EPD), the method comprising:
   performing a vertical gradient freeze (VGF) crystal growth process to grow a GaAs ingot, including:
      providing a crucible containing a seed crystal, GaAs raw material, and $B_2O_3$ material, in an ampoule;
      providing a solid carbon substance in a lower region of the ampoule outside the crucible;
      sealing under vacuum the ampoule containing the solid carbon substance and the crucible;
      heating the sealed ampoule in a controlled manner causing the GaAs raw material to melt, the heat interacting with the solid carbon substance to produce a carbon gas which interacts with the GaAs melt through the $B_2O_3$ material;
      controlling a temperature gradient at a melt/crystal interface during the vertical gradient freeze crystal growth wherein the temperature gradient at the melt/crystal interface is between about 0.1 to about 2 degrees Celsius;
      controlling a shape of the melt/crystal interface during the vertical gradient freeze crystal growth wherein the shape is concave or convex to a melt front at no more than about ±2 mm;
      controlling a crystallization velocity during the vertical gradient freeze crystal growth wherein the crystallization velocity is between about 2 and about 16 mm/hour;
   obtaining a gallium arsenide 6 inch diameter wafer from the GaAs ingot;
   performing an annealing process on the gallium arsenide wafer using a single step anneal, wherein the annealing process comprises controlling a heating rate during the annealing between 900 to 1050 degrees Celsius over 10 to 48 hours, as well as controlling a cooling rate during the annealing wherein the cooling rate is to room temperature in 6 to 24 hours, and removing a portion of the surface of the gallium arsenide wafer, such that the annealing and the surface removal steps provide gallium arsenide crystals having less than a total of 50 light point defects, and a light point defect density of less than about 1 per square centimeter per wafer, with a particle size of equal to or greater than about 0.3 micrometers;
   wherein, as a result of a combination of the vertical gradient steps, the crystallization control steps and the annealing process, gallium arsenide crystals are reproducibly provided having an etch pit density that is achieved without use of contact or external gas source supplied doping techniques and is less than 600 per square centimeter.

2. A method for manufacture a 6 inch diameter gallium arsenide wafer with a low etch pit density (EPD), the method comprising:
   forming polycrystalline gallium based compounds; and
   performing vertical gradient freeze (VGF) crystal growth to grow a GaAs ingot using the polycrystalline gallium based compounds, wherein the step of performing comprises:
      providing a crucible containing a seed crystal, GaAs raw material, and $B_2O_3$ material, in an ampoule;
      providing a solid carbon substance in a lower region of the ampoule outside the crucible;
      sealing under vacuum the ampoule containing the solid carbon substance and the crucible;
      heating the sealed ampoule in a controlled manner causing the GaAs raw material to melt, the heat interacting with the solid carbon substance to produce a carbon gas which interacts with the GaAs melt through the $B_2O_3$ material;
      controlling a temperature gradient at a melt/crystal interface during the vertical gradient freeze crystal growth wherein the temperature gradient at the melt/crystal interface is between about 0.1 to about 2 degrees Celsius;
      controlling a shape of the melt/crystal interface during the vertical gradient freeze crystal growth wherein the shape is concave or convex to a melt front at no more than about ±2 mm,
      controlling a crystallization velocity during the vertical gradient freeze crystal growth wherein the crystallization velocity is between about 2 and about 16 mm/hour;
      controlling melt/crystal interface during formation of the gallium based crystal such that the gallium based crystal has an etch pit density of less than about 600 per square centimeter;
   obtaining a polycrystalline gallium arsenide substrate from the GaAs ingot;
   annealing the polycrystalline gallium arsenide based substrate using a single step annealing process, wherein the annealing process comprises controlling a heating rate during the annealing between 900 to 1050 degrees Celsius over 10 to 48 hours, as well as controlling a cooling rate during the annealing wherein the cooling rate is to room temperature in 6 to 24 hours; and removing a portion of the surface of the polycrystalline gallium based substrate to form a polycrystalline gallium arsenide based substrate having a light point defect density of less than about 1 per square centimeter per polycrystalline gallium arsenide based substrate with a particle size of equal to or greater than about 0.3 micrometers;

wherein, as a result of the VGF crystal growth, the annealing and the surface removal steps, gallium arsenide crystals having less than a total of 50 light point defects are achieved.

* * * * *

UNITED STATES PATENT AND TRADEMARK OFFICE
CERTIFICATE OF CORRECTION

| | |
|---|---|
| PATENT NO. | : 8,361,225 B2 |
| APPLICATION NO. | : 13/207291 |
| DATED | : January 29, 2013 |
| INVENTOR(S) | : Weiguo Liu et al. |

It is certified that error appears in the above-identified patent and that said Letters Patent is hereby corrected as shown below:

In the Claims:

Column 6

Line 61 "substrate" should read --wafer--

Column 7

Line 2 "substrate" should read --wafer--

Line 3 "substrate" should read --wafer--

Line 5 "substrate" should read --wafer--

Signed and Sealed this
Twenty-first Day of May, 2013

Teresa Stanek Rea
*Acting Director of the United States Patent and Trademark Office*